United States Patent
Müller et al.

(10) Patent No.: US 9,485,400 B2
(45) Date of Patent: Nov. 1, 2016

(54) CAMERA MODULE AND METHOD FOR THE PRODUCTION THEREOF

(71) Applicant: Conti Temic Microelectronic GmbH, Nürnberg (DE)

(72) Inventors: Gerhard Müller, Bad Waldsee (DE); Dieter Krökel, Eriskirch (DE)

(73) Assignee: Conti Temic Microelectronic GmbH (DE)

( * ) Notice: Subject to any disclaimer, the term of this patent is extended or adjusted under 35 U.S.C. 154(b) by 0 days.

(21) Appl. No.: 14/769,941

(22) PCT Filed: Feb. 11, 2014

(86) PCT No.: PCT/DE2014/200047
§ 371 (c)(1),
(2) Date: Aug. 24, 2015

(87) PCT Pub. No.: WO2014/146656
PCT Pub. Date: Sep. 25, 2014

(65) Prior Publication Data
US 2016/0014313 A1   Jan. 14, 2016

(30) Foreign Application Priority Data
Mar. 19, 2013   (DE) .................... 10 2013 102 819 U

(51) Int. Cl.
*H04N 3/14*   (2006.01)
*H04N 5/335*   (2011.01)
*H04N 5/225*   (2006.01)

(52) U.S. Cl.
CPC .......... *H04N 5/2257* (2013.01); *H04N 5/2253* (2013.01); *H04N 5/2254* (2013.01); *H01L 2924/0002* (2013.01)

(58) Field of Classification Search
CPC ............................ H04N 5/225; H04N 5/2253

USPC .................................................. 348/374, 294
See application file for complete search history.

(56) References Cited

U.S. PATENT DOCUMENTS

| 6,147,389 | A | 11/2000 | Stern | |
|---|---|---|---|---|
| 6,414,299 | B1 * | 7/2002 | Churei | G02B 7/02 250/201.2 |

(Continued)

FOREIGN PATENT DOCUMENTS

| DE | 102004044503 | 3/2006 |
|---|---|---|
| DE | 102005006756 | 8/2006 |

(Continued)

OTHER PUBLICATIONS

German Search Report for German Application No. 10 2013 102 819.5 mailed Dec. 3, 2013, including partial translation.

(Continued)

*Primary Examiner* — Antoinette Spinks
(74) *Attorney, Agent, or Firm* — RatnerPrestia

(57) ABSTRACT

A camera module including an objective lens housing with an optical system, an image sensor chip with wire bonding connections, and a printed circuit board for contacting the image sensor chip. The printed circuit board is designed with wire bonding areas to which the wire bonding connections of the image sensor chip are connected, and the assembly made up of the image sensor chip and the printed circuit board is designed in such a manner that the image sensor chip is focus-adjusted to the optical system by changing its position relative to the printed circuit board taking advantage of the flexibility of the wire bonding connections of the image sensor chip. The invention further relates to a method of manufacturing the camera module.

20 Claims, 4 Drawing Sheets

(56) References Cited

U.S. PATENT DOCUMENTS

| | | |
|---|---|---|
| 6,683,654 B1 | 1/2004 | Haijima |
| 7,829,833 B2 * | 11/2010 | Kobayashi ........ H01L 27/14618 250/208.1 |
| 8,866,965 B2 | 10/2014 | Uenaka |
| 2005/0140792 A1 | 6/2005 | Hermsen |
| 2008/0017942 A1 | 1/2008 | Kosaka |
| 2008/0291322 A1 | 11/2008 | Schick |
| 2008/0316350 A1 | 12/2008 | Gottwald |
| 2009/0109318 A1 | 4/2009 | Chang |
| 2009/0295986 A1 | 12/2009 | Topliss |
| 2012/0111712 A1 * | 5/2012 | Cour ...................... H01H 13/48 200/511 |
| 2015/0230339 A1 * | 8/2015 | Arnold ................ H01L 29/0657 345/173 |

FOREIGN PATENT DOCUMENTS

| | | |
|---|---|---|
| DE | 102011011527 | 8/2012 |
| JP | 2013041054 | 2/2013 |
| WO | 03061276 | 7/2003 |
| WO | 2006087284 | 8/2006 |

OTHER PUBLICATIONS

International Search Report for International Application No. PCT/DE2014/200047 mailed Jun. 17, 2014.

International Preliminary Report on Patentability and Written Opinion for International Application No. PCT/DE2014/200047 issued Sep. 22, 2015.

* cited by examiner

CAMERA MODULE AND METHOD FOR THE PRODUCTION THEREOF

CROSS REFERENCE TO RELATED APPLICATIONS

This application is the U.S. National Phase Application of PCT/DE2014/200047, filed Feb. 11, 2014, which claims priority to German Patent Application No. 10 2013 102 819.5, filed Mar. 19, 2013, the contents of such applications being incorporated by reference herein.

FIELD OF THE INVENTION

The invention relates to a camera module comprising an objective lens housing with an optical system, a support plate on which the objective lens housing is supported, and an image sensor chip with wire bonding connections. The invention further relates to a method of manufacturing such a camera module according to the invention

BACKGROUND OF THE INVENTION

Camera modules of this type installed in vehicles serve to record the surroundings of the vehicle in order to be able to use the image data for numerous functions, such as lane detection, traffic sign recognition, high-beam assistant, collision warning, pedestrian detection, etc., wherein the analyzed image data is also used as a basis for intervening in vehicle control systems, e.g. braking or engine controls. If such camera modules are to be used a fixed-focus camera system in driver assistance systems, it is crucial that they have a certain quality with regard to focusing and tilting.

In general, these camera modules have a structure consisting of a printed circuit board which serves as a support plate and on which an image sensor is mounted, and an optical system fixed thereto. The objective lens of the optical system is either held in place by an objective lens holder or fixed directly to the support plate.

To focus the optical system, a fixing solution is required which enables the distance between the optical elements of the optical system and the image sensor to be adjusted. In the simplest case, this is done by means of a screw thread. The drawback of this is that only one adjustment along one axis is possible in this way.

To be able to adjust several axes, an adhesive connection is often the method of choice. To focus the camera module, a structure is mostly selected where a target on which said module is to be focused is positioned at a defined distance in front of the camera module. In this adjustment structure, the image sensor is operated, and the position of the optical system is moved after the adhesive has been applied. The sequence of images taken during the movement process can be used to determine the best focus position of the optical system. To determine this point of best focus, sharpness values of the images taken at the different positions are recorded in a diagram and used to determine a sharpness curve. The local maximum of this sharpness curve indicates the best focus position as a function of the distance from the target. By making a defined addition to this position, the structure and method described above can also be used to set the focus to a distance other than the target distance. Once the focus position has been adjusted, the adhesive is cured, thus securing the adjustment.

However, this method has the following drawbacks, which are in particular due to the adhesive connection:

An electrical connection between the support plate and the processing unit of the camera module is required. If the optical elements are held at the objective lens, a certain force is exerted on the adhesive connection regardless of how the electrical connection is designed. Therefore said adhesive connection must be adapted to the forces that may occur.

The adhesive is often cured using UV light and/or heat. The time taken for the adhesive to cure very often predetermines the cycle time for the production of such a camera module. This entails long production times and hence high manufacturing costs, and The adhesive connection must be stable over a long time in different environmental conditions, in particular in the automobile sector. In this context, attention must be paid to the weight of the optical system and the support plate, in particular due to mechanical shock and vibration.

The last-mentioned drawback is avoided in a known camera module according to DE 10 2011 011 527 A1, which is incorporated by reference by providing a shared module housing for the optical system and the image sensor, wherein a printed circuit board on which the image sensor is mounted can be inserted into the module housing and arranged and aligned accurately behind the optical elements within the module housing through engagement and adjustment openings, and wherein the printed circuit board with the image sensor is connected to the module housing by means of an adhesive connection in order to allow for focus adjustment. Compared to a prior-art assembly, this adhesive connection only needs to carry the weight of the printed circuit board with the image sensor.

From DE 10 2005 006 756 A1, which is incorporated by reference a camera module is known where no adhesive connection between a support carrying a printed circuit board on which an image sensor is mounted and an optical system or a camera housing is provided to allow for focus adjustment. To focus-adjust the image sensor, the support can be moved within a housing of the camera module along several axes, so that the support can be fixed in place using mechanical fixing means, e.g. screws, once an optimum adjustment position has been reached. However, for the support to be movable, much assembly work is required, resulting in high manufacturing costs of the camera module.

SUMMARY OF THE INVENTION

Based on this state of the art, an aspect of the invention provides a camera module of the kind mentioned in the opening paragraph which has an easy-to-assemble structure without the drawbacks mentioned above but nevertheless allows the focus to be adjusted with high precision. A further aspect provides a method of manufacturing such a camera module according to the invention.

According to an aspect of the invention, such a camera module comprising an objective lens housing with an optical system, an image sensor chip with wire bonding connections, and a printed circuit board for contacting the image sensor chip is characterized in that the printed circuit board is designed with wire bonding areas to which the wire bonding connections of the image sensor chip are connected, and the assembly made up of the image sensor chip and the printed circuit board is designed in such a manner that the image sensor chip is focus-adjusted to the optical system by changing its position relative to the printed circuit board taking advantage of the flexibility of the wire bonding connections of the image sensor chip.

In this camera module according to an aspect of the invention, the finding that the wire bonding connections of the image sensor chip have some flexibility is used in a surprising way to change the position of the image sensor chip in order to focus the image sensor chip on the optical system after the image sensor chip has been contacted with the wire bonding areas of the printed circuit board. In this way, an easy-to-assemble structure is obtained since the objective lens housing which includes the optical elements can be securely connected to a support plate, e.g. by pressing, welding, etc.

By taking advantage of the certain flexibility of the wire bonding connections of the image sensor chip, a high precision of focus of up to ±10 μm is achieved in a simple manner, without a need to specify an increased tolerance requirement for the other components of the camera module according to the invention. The increased precision of focus enables the pixel size of the image sensor chip to be made smaller, and hence its resolution to be increased, without higher-quality optical elements being required for the optical system.

According to an advantageous further development of the invention, the image sensor chip is arranged on a chip support, and the chip support with the image sensor chip is focus-adjusted to the optical system by changing its position relative to the printed circuit board. By arranging the image sensor chip on a chip support, the process of focus adjustment is simplified.

In this further development, the structure of the camera module according to the invention includes a support plate which has a recess adapted to the contour of the chip support and is arranged on the printed circuit board while the chip support is received in the recess. In this way, an easy-to-assemble structure and a simple assembly process of the camera module are obtained since the support plate and the chip support arranged in its recess can be jointly arranged on the printed circuit board. Preferably the printed circuit board has at least one access opening in the region of the chip support, through which the chip support is accessible in order to be moved to focus it on the optical system.

The chip support is focused and fixed in place in an easy manner by gripping it through the access opening in the printed circuit board located below the chip support.

According to a further development of the invention, this opens up the opportunity to convert a fixed-focus camera to an autofocus camera by connecting the chip support to micromechanical components through the access opening, so that the focus is adjusted during operation of the camera module by activating a focusing feature.

According to another configuration of the invention, an alternative structure of the camera module of the invention is proposed, according to which:
- a support plate is provided which has a recess adapted to the contour of the chip support,
- furthermore, the printed circuit board has a receiving opening adapted to the contour of the image sensor chip and is arranged on the support plate, the receiving opening and the recess being centered to each other, and
- the chip support is arranged in the recess of the support while the image sensor chip is received in the receiving opening.

The advantage of this structure is that the chip support is more accessible, and hence it is easier to introduce a fixing means, such as an adhesive. Therefore an access opening in the printed circuit board, as required in the above structure, is not necessary.

To focus-adjust the image sensor chip to the optical system, the chip support must be fixed in place relative to the support plate and/or the printed circuit board by means of a fixing means.

In one configuration of the invention, such a fixing means is designed as an adhesive connection which connects the chip support at least with the support plate and/or the printed circuit board. Therefore such an adhesive connection needs no longer hold the weight of the objective lens housing with the optical system but only the much lighter chip support with the image sensor chip.

Another particularly advantageous configuration of the invention proposes that the fixing means be designed as at least one plastically deformed bridge connecting the chip support with the support plate.

In this configuration of the invention, the chip support is connected to the support plate by means of at least one, preferably three, bridge(s) distributed along the circumference, wherein, following manufacture of the printed circuit board on which the support plate including the chip support is mounted, the at least one bridge is plastically deformed, i.e. bent in such a manner that at least the distance of the image sensor chip from the optical system can be adjusted in this way in order to focus the image sensor chip on the optical system. To this end, the chip support is manufactured by making cut-outs in the support plate, so that in addition contact to the printed circuit board located below can be made through the cut-outs. The material of the support plate must be selected to have the material properties which are required to allow for said plastic deformation of such a bridge or such bridges. The bridges need not be distributed equidistantly along the circumference.

As a result, no adhesive connection is required for focus adjustment. This embodiment of the invention also takes advantage of the flexibility of the wire bonding connections of the image sensor chip to be able to move the latter to an optimum focus position. Nothing needs to be fixed in place separately since the bridge(s) is/are bent in such a manner that a permanent plastic deformation is achieved.

The second-mentioned object is achieved by a method having the features of patent claim 10.

This method of manufacturing a camera module is characterized at least by the following method steps:
- Contacting the wire bonding connections with the wire bonding areas of the printed circuit board,
- Focus-adjusting the image sensor chip to the optical system by moving the image sensor chip relative to the printed circuit board taking advantage of the flexibility of the wire bonding connections of the image sensor chip, and
- Fixing in place the adjusted image sensor chip relative to the printed circuit board.

The finding that the wire bonding connections of the image sensor chip have some flexibility is used to change or move the position of the image sensor chip in order to focus it on the optical system after the image sensor chip has been contacted with the wire bonding areas of the printed circuit board. In this way, an easy-to-assemble structure is obtained since the objective lens housing which includes the optical elements can be securely connected to a support plate, e.g. by pressing, welding, etc.

In an advantageous configuration, the method according to the invention includes at least the following steps:

Forming the printed circuit board on which the chip support and the support plate are mounted, and contacting the wire bonding connections with the wire bonding areas of the printed circuit board, Forming an objective lens housing with an optical system, Connecting the objective lens housing to the support plate in a force-based, shape-based or material-based manner, Adjusting the chip support by moving it along the optical axis of the optical system using adjustment means, and Fixing in place the adjusted chip support using a fixing means.

Since the chip support is arranged on the printed circuit board, the chip support is adjusted through a through hole in the printed circuit board located below, in the region of the image sensor chip, using suitable gripping means. Fixing by means of fixing means, preferably by means of an adhesive connection between the chip support and the support plate and/or the printed circuit board, is also done through a through hole.

With regard to the alternative structure of the camera module according to the invention where the printed circuit board is arranged on the support plate, a method according to a further development includes at least the following steps:

Forming the assembly made up of the support plate and the printed circuit board arranged thereon, the receiving opening and the recess being centered to each other, Forming an objective lens housing with an optical system, Connecting the objective lens housing to the support plate in a force-based, shape-based or material-based manner, Forming the chip support with the image sensor chip, Adjusting the chip support by moving it along the optical axis of the optical system using adjustment means, and Fixing in place the adjusted chip support using a fixing means.

Fixing by means of fixing means, preferably by means of an adhesive connection between the chip support and the support plate and/or the printed circuit board, is easy since the chip support is easily accessible from below in this structure.

If the bridges connecting the chip support with the support plate are provided as fixing means, the manufacture of a camera module according to the invention includes at least the following method steps:

Forming the support plate with at least one chip support connected thereto by at least one bridge, Mounting the support plate on the printed circuit board, and contacting the wire bonding connections with the wire bonding areas of the printed circuit board, Forming an objective lens housing with an optical system, Connecting the objective lens housing to the support plate in a force-based or shape-based manner, Adjusting and fixing in place the chip support by plastically deforming the at least one bridge.

According to this further development, the plastic bending of the at least one bridge, or the preferably three bridges, is done by exerting a force on the chip support in the immediate vicinity of the bridge(s), so that a plastic deformation of the bridge(s) is obtained.

According to a further development, it is also possible to achieve the plastic deformation of the at least one bridge, or the bridges, by supplying energy, e.g. by means of a laser.

Furthermore, this method according to the invention can be developed further to include the following method steps:

Measuring the current focus position by means of a focusable collimator to determine a sharpness curve, Using the sharpness curve to determine a correction value for the plastic bending of the at least one bridge in order to achieve an optimum focus position, and Adjusting to the optimum focus position according to the determined correction value by plastically bending the at least one bridge taking into account the elasticity of the material of the bridge(s).

If such a focusable collimator with a reticle in the front focal plane of the optical system of the camera module is used, different object distances can be set for the optical system, so that a sharpness curve can be recorded when the image sensor chip is active, which can then be used to determine the position of the point of optimum focus and a correction value in order to permanently deform the at least one bridge, or the preferably three bridges, according to this correction value.

According to a further development, the last-mentioned method is designed in such a manner that, before measuring the current focus position, the chip support is pre-tensioned by exerting a force on the at least one bridge, or the preferably three bridges. In this way, any play which may be present is eliminated from the structure of the camera module.

Furthermore, this method according to the invention can be designed in such a manner that, before determining a correction value, the at least one bridge, or the preferably three bridges, is/are pre-bent by exerting a force. This pre-bending ensures that the focus position can be measured in a useful way.

A particularly advantageous configuration of the method according to the invention is obtained by using at least three focusable collimators arranged equidistantly on a circular path around the center of the image sensor chip to focus-adjust the image sensor chip throughout the sensor surface. In addition to focusing on the center of the image sensor chip, any tilting of the image sensor chip about the x direction (longitudinal axis of the vehicle) and/or the y direction (transverse axis of the vehicle) and/or the z axis (vertical axis of the vehicle) can be compensated for.

BRIEF DESCRIPTION OF THE DRAWINGS

The invention will now be explained in more detail with reference to the attached figures, in which.

DETAILED DESCRIPTION OF THE PREFERRED EMBODIMENTS

Figure 1:
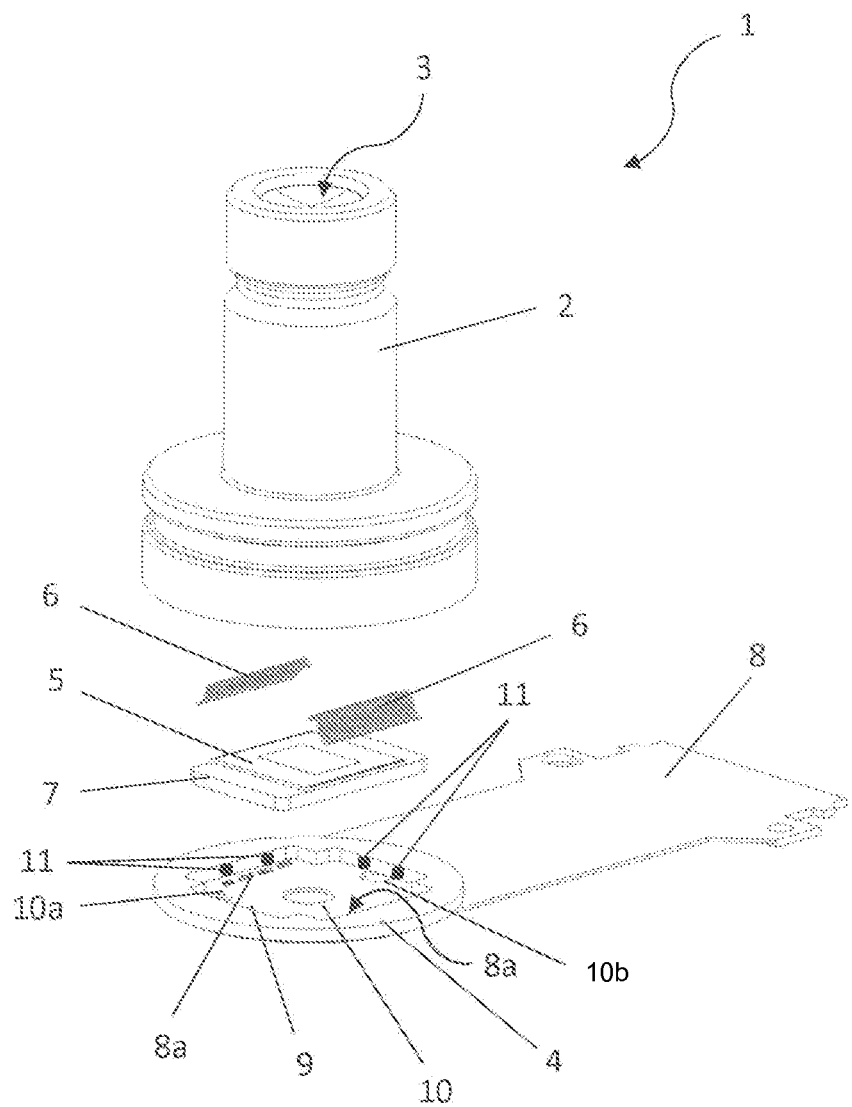
FIG. 1 is a perspective exploded view of a camera module according to the invention as a first exemplary embodiment.

The first exemplary embodiment of a camera module 1 according to an aspect of the invention according to FIG. 1 comprises an objective lens housing 2 with an optical system 3 including several lenses (not visible in FIG. 1), which housing is connected to a support plate 4 in a force-based, shape-based or material-based manner, e.g. by pressing, welding, etc, an image sensor chip 5 arranged on a chip support 7, e.g. by means of an adhesive connection, as a "bar die" having wire bonding connections 6, a flexible printed circuit board 8 having wire bonding areas 8a for contacting the image sensor chip 5, and a circular support plate 4 having a recess 9 for receiving the chip support 7.

The support plate 4 and the chip support 7 are both mounted on the printed circuit board 8, so that the chip support 7 is placed within the recess 9 and rests flat on the printed circuit board 8, enclosed by the support plate 4. The flexible printed circuit board 8 is strip-shaped, so that one end of the printed circuit board 8 is congruent with the circular support plate 4. As can be seen according to FIG. 3, the associated advantage is that the circular support plate 4 can be inserted into an easy-to-manufacture, rotationally symmetric objective lens housing 2 while the flexible printed circuit board 8 can extend beyond this objective lens housing 2.

The contour of the recess 9 in the support plate 4 is adapted to the outer contour of the chip support 7 in such a manner that the two rows of wire bonding connections 6 can also be passed through this recess 9, down to the wire bonding areas 8a of the printed circuit board 8. The recess 9 according to FIG. 1 has a cross-shaped contour.

As a result, the chip support 7 rests loosely on the printed circuit board 8 and is only electrically connected thereto by means of the wire bonding connections 6 which are contacted with the wire bonding areas 8a. Due to the slightly flexible property of the wire bonding connections 6, the chip support 7 can be moved a little in position within the recess 9 after the image sensor chip 5 has been contacted. This opens up the opportunity to focus the image sensor chip 5 on the optical system 3 by moving the chip support 7.

To make an adjustment, gripping means are provided by means of which the chip support 7 can be gripped through an access opening 10 which is centered relative to the recess 9 in the printed circuit board 8. Optionally, further access openings 10a and 10b are provided.

The position of the image sensor chip 5 for optimum focus is determined by the method described above, wherein the position of the chip support 7, rather than the position of the optical system 3, is changed taking advantage of the flexible wire bonding connections 6 which allow the image sensor chip 5 to be moved. As described above, a target to be focused is positioned at a defined distance in front of the camera module 1, and the active image sensor chip 5 is moved by means of the gripping means, and the sequence of images recorded during this movement process is first used to determine a sharpness curve which is then used to determine the position of the image sensor chip 5 for the best focus as a function of the distance from the target. By making a defined addition to this position, the focus is set to a distance other than the target distance.

Once the chip support 7 has been adjusted in this manner, it is focus-adjusted to the optimum focus position by means of an adhesive connection made by introducing an adhesive through the access opening 10 and/or the further access openings 10a and 10b. Such an adhesive or adhesive connection used as a fixing means is indicated schematically in FIG. 1 by a reference numeral 11.

Figure 3:
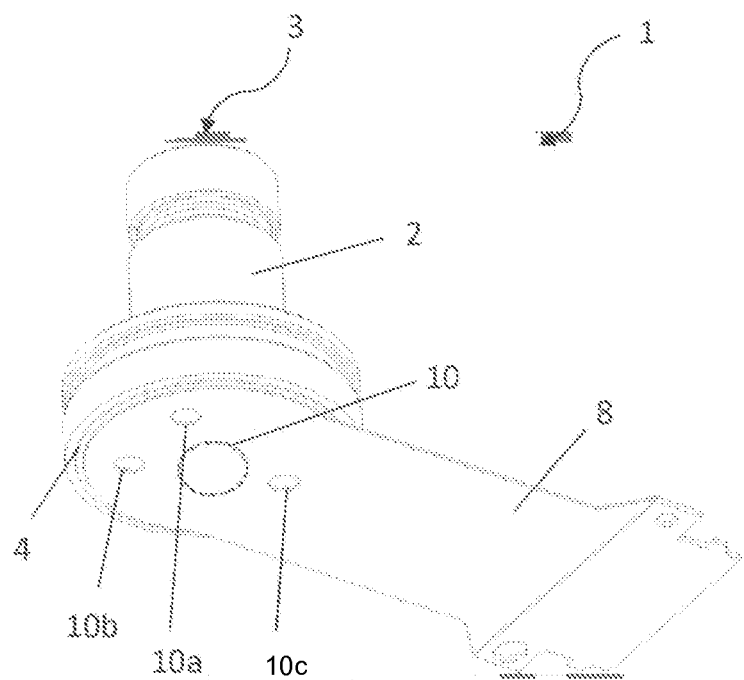
FIG. 3 is a perspective view of the camera module according to FIG. 1 and FIG. 2 in a plan view from below.

FIG. 3 shows a plan view from below of a camera module 1 manufactured in this way, wherein the access opening 10 in the flexible printed circuit board 8 is only illustrated by dashed lines.

If the chip support 7 is not fixed in place by means of an adhesive connection, the camera module 1 designed as a fixed-focus camera can be converted to an autofocus camera by connecting the chip support 7 to micromechanical components through the printed circuit board 8, so that the focus can be adjusted during operation of the camera module by activating a focusing feature (focus control).

Figure 2:
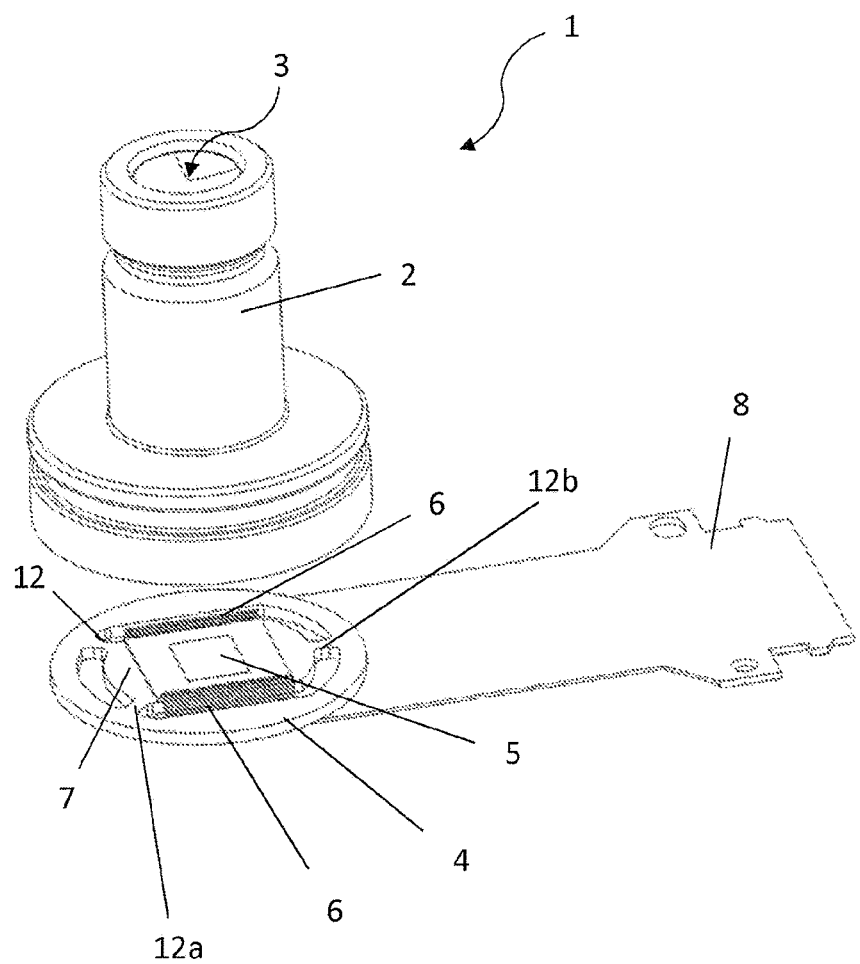
FIG. 2 is a perspective exploded view of a camera module according to the invention as a second exemplary embodiment.

FIG. 2 shows a second exemplary embodiment of a camera module 1, whose structure corresponds to that according to FIG. 1. The difference compared to the camera module 1 according to FIG. 1 is that the chip support 7 is connected to the support plate 4 by means of three narrow bridges 12, 12a, 12b distributed along its circumference, which bridges 12, 12a, 12b need not be distributed along the circumference in an equidistant manner. To this end, this chip support 7 is cut out of the support plate 4 in such a manner that not only the aforesaid bridges 12, 12a, 12b are obtained but that the cut-outs between these bridges 12, 12a, 12b enable the wire bonding connections 6 of the image sensor chip 5 to be passed therethrough, down to the printed circuit board 8 located below, so that they can be contacted with the wire bonding areas 8a.

Once the support plate 4 with the chip support 7 connected thereto by the three bridges 12, 12a, 12b has been manufactured, the support plate 4 has been mounted on the printed circuit board 8, and the image sensor chip 5 has been contacted with the wire bonding areas 8a, and the objective lens housing 2 with the optical system 3 has been connected to the support plate 4 in a force-based, shape-based or material-based manner, the chip support 7 is adjusted and fixed in place by plastically deforming the bridges 12, 12a and 12b in order to focus the image sensor chip 5 on the optical system 3.

To this end, a force which deforms the bridges 12, 12a and 12b is supplied into the chip support 7 at positions in the immediate vicinity of to said bridges. This support plate 4 is made of a material which allows the bridges 12, 12a and 12b to be deformed by exerting such a force on the chip support 7, so that the distance of the chip support 7 and hence the distance of the image sensor chip 5 from the optical system 3 is changed as a result.

According to FIG. 3, the flexible printed circuit board 8 is provided with access openings 10a, 10b and 10c through which a force is exerted on the chip support 7 in the immediate vicinity of the three bridges 12, 12a and 12b. These access openings 10a, 10b and 10c can be closed once the focus adjustment has been made, in order to seal the camera module 1. Another option is to use a flexible printed circuit board 8 which is sufficiently flexible, so that the access openings 10a, 10b and 10c can be omitted.

A permanent plastic deformation of the bridges 12, 12a and 12b can not only be achieved by mechanically exerting a force which deforms these bridges 12, 12a and 12b but, if a suitable material is used, these bridges 12, 12a and 12b can also be deformed by supplying energy, e.g. by means of a laser, in order to adjust the distance between the image sensor chip 5 and the optical system 3.

To adjust the focus of the image sensor chip 5 to the optical system 3 and to secure the image sensor chip 5 in the appropriate position, a focusable collimator including a reticle is used to determine the actual focus position based on a sharpness curve.

If the reticle is arranged in the front focal plane of the camera module 1, the pattern of the reticle is imaged behind the lens at infinity. In case of a focusable collimator, the position of the reticle can be changed, thus generating a converging or diverging focused beam for the optical system, so that the camera module can be set to different object distances which can even be beyond infinity in order to measure the focus position. Instead of moving the image sensor chip 5 relative to the optical system, the reticle in the collimator is moved now. The sharpness values of the images taken at different reticle positions in the collimator can again be used to determine a sharpness curve.

In this way, the setting of the collimator is changed, rather than moving the chip support 7 with the image sensor chip 5, in order to determine the position of the point of best focus. If a camera module 1 is built where the image sensor chip 5 is placed behind the best focus position, this position can be measured to determine a correction value by which the bridges 12, 12a and 12b must be bent in order to achieve the optimum focus position.

The procedure for making such an adjustment can include several steps, the steps being as follows:

Pre-tensioning the position of the chip support 7 to eliminate play from the structure of the camera module 1, Optionally, pre-bending the bridges 12, 12a and 12b by exerting a force on the chip support 7 until a useful measurement of the focus position can be made, Measuring the current focus position and determining the difference from the optimum focus position or a correction value based on the obtained sharpness curve, and Adjusting to the optimum focus position by plastically deforming the bridges 12, 12a and 12b based on the measurement, i.e. according to the determined correction value, taking into account the material elasticity of the bridges 12, 12a and 12b and the bending done before, if any.

The method for focus adjustment by plastically deforming the bridges 12, 12a and 12b by exerting a force on the chip support 7 must be controlled via the force path, so that individual parameters are balanced based on the module camera 1 to be focused and on the forces that have been measured in each case.

To ensure correct focusing of the image sensor chip 5 throughout the sensor surface, i.e. to also compensate for tilting about the x, y and z axes of a vehicle, the measurement is done at a minimum of three points which are substantially arranged equidistantly on a circular path around the center of the image sensor chip 5. Advantageously, an adjustment structure including five focusable collimators is used to measure the camera module, one collimator being aligned with the center and each of the four others being aligned with the corner regions of the image sensor chip 5. This structure can also be used to determine the focus position and the amount of movement required for focus adjustment in each case.

If a support plate 4 made of a material with sufficiently elastic properties is used, the method described above can be used. To this end, the bridges 12, 12a and 12b are deformed beyond the position of the point of best focus. The amount of excess bending is then adjusted to correspond to the elastic deformation of the bridges 12, 12a and 12b. Once the force exerted on the chip support 7 is released, the latter, together with the image sensor chip 5, springs back to the best focus position.

Furthermore it is possible to install an optical attachment in the adjustment structure between the camera module 1 and the target, which attachment selectively moves the point of focus to the rear. In this way, a focus maximum can be determined during the deformation process, and a defined addition is made.

The essential advantages of the method for focusing a camera module 1 designed according to FIG. 2 are, on the one hand, that the connection between the support plate 4 and the optical system 3 can be made using a stable connection technique which does not require an adhesive and where forces acting on the printed circuit board 8 as a result of contacting the camera module 1 do not affect focusing, and, on the other, that no adhesive connection is required for focus adjustment.

The fact that there is no adhesive connection has the advantages that several manufacturing process steps, such as application of an adhesive and time taken for the adhesive to cure, are no longer needed, thus optimizing production time, changes of the adhesive over the lifetime are no longer relevant, ensuring that the focus remains much more precise over the lifetime, and on the one hand, the precise focus achieved in this way allows the tolerance requirements (both mechanical and optical) made of the other components involved to be reduced, with a corresponding reduction in manufacturing costs, and, on the other, the higher precision of focus combined with unchanged tolerance requirements enables the pixel size to be reduced, thus increasing image resolution without the use of higher-quality optical elements.

Figure 4:
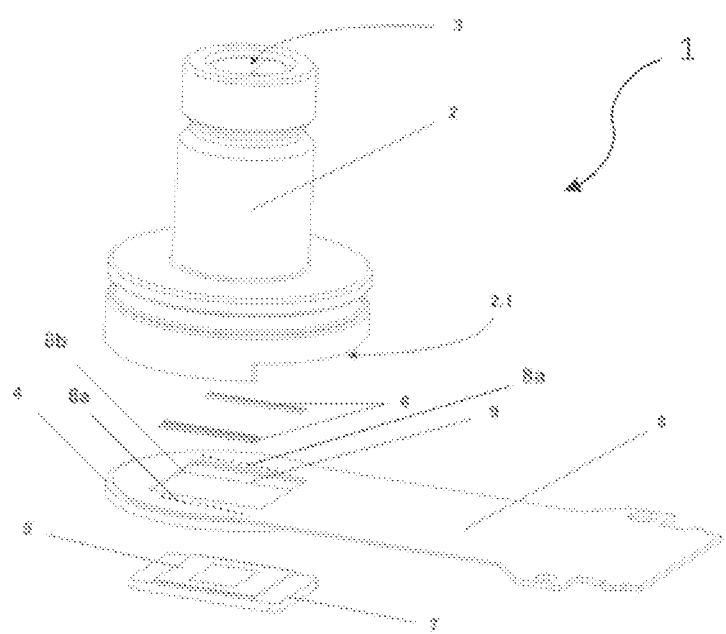
FIG. 4 is a perspective exploded view of a camera module according to the invention as a third exemplary embodiment.
Figure 5:
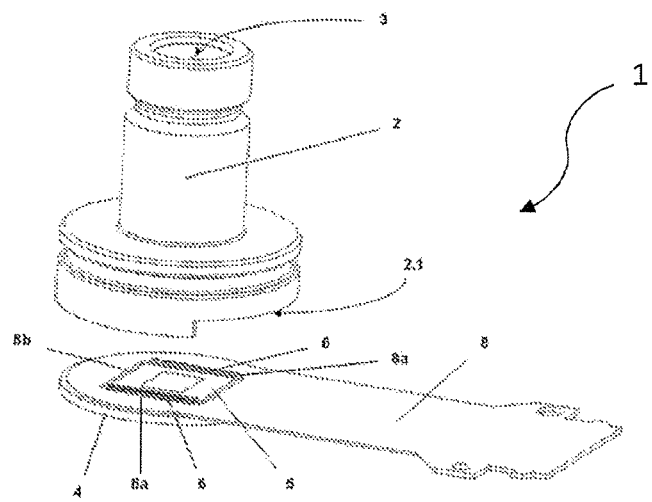
FIG. 5 is another perspective exploded view of the camera module according to FIG. 4.
Figure 6:
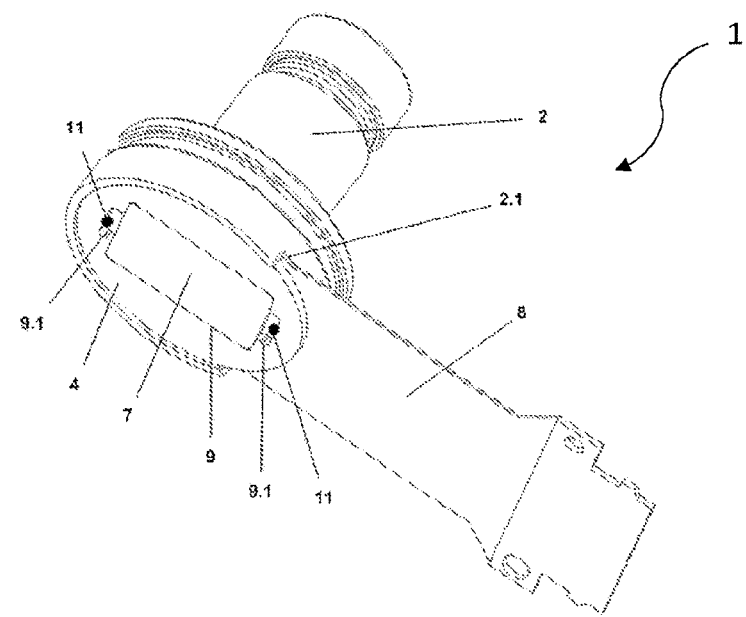
FIG. 6 is a perspective view of the camera module according to FIG. 4 and FIG. 5 in a plan view from below.

FIGS. 4, 5 and 6 show a third embodiment of a camera module 1 according to the invention. The structure of this camera module 1 differs from that according to FIG. 1 in that the chip support 7 with the image sensor chip 5 arranged thereon as well as the support plate 4 are not arranged on the printed circuit board 8 but, the other way round, the printed circuit board 8 is arranged on the support plate 4, as will be explained below with reference to FIGS. 4 to 6.

This camera module 1, as a third exemplary embodiment, again comprises an objective lens housing 2 with an optical system 3 including several lenses (not visible in the figures), which housing is connected to a support plate 4 in a force-based, shape-based or material-based manner, e.g. by pressing, welding, etc, an image sensor chip 5 arranged on the chip support 7, e.g. by means of an adhesive connection, as a "bar die" having wire bonding connections 6, a flexible printed circuit board 8 having wire bonding areas 8a for contacting the image sensor chip 5, and a circular support plate 4 having a recess 9 for receiving the chip support 7.

In contrast to the other exemplary embodiments, this printed circuit board 8 has a receiving opening 8b and is arranged on the support plate 4 in such a manner that the recess 9 of the support plate 4 and this receiving opening 8b of the printed circuit board are centered to each other. As a result, the chip support 7 with the image sensor chip 5 arranged thereon can be inserted into this opening formed jointly by the recess 9 and the receiving opening 8b from below, i.e. from the underside of the support plate 4, so that the chip support 7 is enclosed by the support plate 4 and both form a shared lower surface, as can be seen in FIG. 6. On the opposite side, the image sensor chip 5 is enclosed by the printed circuit board 8 and is electrically connected to the wire bonding areas 8a of the printed circuit board 8 by means of its wire bonding connections 6.

As a result, the chip support 7 rests loosely within the recess 9 of the support plate 4 and is only contacted with the printed circuit board 8 arranged on the support plate 4 by means of the image sensor chip 5 and the wire bonding areas 8a. Due to the slightly flexible property of the wire bonding connections 6, the chip support 7 can be moved a little in position within the recess 9 after the image sensor chip 5 has been contacted. This opens up the opportunity to focus the image sensor chip 5 on the optical system 3 by moving the chip support 7.

Before the image sensor chip 5 is focus-adjusted, the objective lens housing 2 is connected to the support plate 4 in a force-based, shape-based or material-based manner, e.g. by pressing, welding, etc. As can be seen in FIG. 6, the diameter of this support plate 4 is selected such that it can be inserted into the easy-to-manufacture, rotationally symmetric objective lens housing 2. To make this possible, the slat-shaped and flexible printed circuit board 8 has a circular end whose diameter is the same as the diameter of the support plate 4. As a result, the assembly made up of the support plate 4, the chip support 7 with the image sensor chip 5 arranged thereon and the circular end of the printed circuit board 8 arranged on the support plate 7 are received completely within the cylindrical objective lens housing 2 while the strip-shaped portion of the printed circuit board 8 extends out of the objective lens housing 2 through a cut-out 2.1 thereof.

To adjust the image sensor chip 5, gripping means are provided by means of which the chip support 7 can be easily gripped on the exposed underside thereof. This can also be improved if rectangular cut-outs 9.1 are provided on opposite sides of the recess 9.

In this embodiment, it is also possible to convert the fixed-focus camera to an autofocus camera by connecting the chip support 7 to micromechanical components from the underside and adjusting the focus during operation of the camera module by activating a focusing feature (focus control).

The position of the image sensor chip 5 for optimum focus is determined by the method described above, wherein the position of the chip support 7, rather than the position of the optical system 3, is changed taking advantage of the flexible wire bonding connections 6 which allow the image sensor chip 5 to be moved. As described above, a target to be focused is positioned at a defined distance in front of the camera module 1, and the active image sensor chip 5 is moved by means of the gripping means, and the sequence of images recorded during this movement process is first used to determine a sharpness curve which is then used to determine the position of the image sensor chip 5 for the best focus as a function of the distance from the target. By making a defined addition to this position, the focus is set to a distance other than the target distance.

Once the chip support 7 has been adjusted in this manner, it is focus-adjusted to the optimum focus position by means of an adhesive connection made by introducing an adhesive from the accessible rear side of the support plate 4 or the chip support 7. To improve the adhesive connection, the adhesive can in addition be introduced into the cut-outs 9.1, so that a good connection to the printed circuit board 8 is achieved as well. Such an adhesive or adhesive connection 11 used as a fixing means is indicated schematically in FIG. 6 by a reference numeral 11.

REFERENCE NUMERALS

1 Camera module
2 Objective lens housing
3 Optical system
4 Support plate
5 Image sensor chip
6 Wire bonding connections of the image sensor chip
7 Chip support
8 Printed circuit board
8a Wire bonding area of the printed circuit board 8
8b Receiving opening of the printed circuit board 8
9 Recess in the support plate 4
9.1 Cut-out of the recess 9
10 Access opening in the printed circuit board 8
10a Access opening in the printed circuit board 8
10b Access opening in the printed circuit board 8
10c Access opening in the printed circuit board 8
11 Fixing means, adhesive connection
12 Fixing means, bridge
12a Fixing means, bridge
12b Fixing means, bridge

The invention claimed is:

1. A camera module comprising:
an objective lens housing with an optical system,
an image sensor chip with wire bonding connections, and
a printed circuit board for contacting the image sensor chip,
wherein
the printed circuit board has wire bonding areas to which the wire bonding connections of the image sensor chip are connected,
and
an assembly comprising the image sensor chip arranged on a chip support and the printed circuit board, wherein the assembly is designed in such a manner that the image sensor chip is focus-adjusted to the optical system by changing the position of the image sensor chip and chip support relative to the printed circuit board taking advantage of the flexibility of the wire bonding connections of the image sensor chip, and
wherein a support plate is provided, which has a recess adapted to a contour of the chip support and is arranged on the printed circuit board while the chip support is received within the recess.

2. The camera module according to claim 1, wherein the printed circuit board has at least one access opening in the region of the chip support through which the chip support is accessible in order to be moved to focus it on the optical system.

3. The camera module according to claim 2, wherein the chip support is connected to micromechanical components through the access opening, so that the focus is adjusted during operation of the camera module by activating a focusing feature.

4. A camera module comprising:
an objective lens housing with an optical system,
an image sensor chip with wire bonding connections, and
a printed circuit board for contacting the image sensor chip,
wherein
the printed circuit board has wire bonding areas to which the wire bonding connections of the image sensor chip are connected, and
an assembly comprising the image sensor chip and the printed circuit board, wherein the assembly is designed in such a manner that the image sensor chip is focus-adjusted to the optical system by changing its position relative to the printed circuit board taking advantage of the flexibility of the wire bonding connections of the image sensor chip,
wherein
a support plate is provided which has a recess adapted to a contour of the chip support,
the printed circuit board has a receiving opening adapted to a contour of the image sensor chip and is arranged on the support plate, the receiving opening and the recess being centered to each other, and the chip support is arranged in the recess of the support plate while the image sensor chip is received in the receiving opening.

5. The camera module according to claim 1, wherein the chip support is fixed in place relative to the support plate and/or the printed circuit board by a fixing means in order to focus-adjust the image sensor chip to the optical system.

6. The camera module according to claim 5, wherein the fixing means is an adhesive connection which connects the chip support at least with the support plate and/or the printed circuit board.

7. The camera module according to claim 5, wherein the fixing means comprising at least one bridge which is plastically deformed and connects the chip support with the support plate.

8. The camera module according to claim 7, wherein the chip support has a circular contour, and three bridges distributed along the circular contour which are plastically deformed and make up the connection to the support plate are provided as the fixing means.

9. A method of manufacturing a camera module comprising an image sensor chip with wire bonding connections, and a printed circuit board for contacting the image sensor chip, an assembly comprising i) the image sensor chip arranged on a chip support having a circular contour and ii) the printed circuit board, a support plate having a recess adapted to a contour of the chip support, the method comprising:

Contacting the wire bonding connections with the wire bonding areas of the printed circuit board, Focus-adjusting the image sensor chip to the optical system by moving the image sensor chip relative to the printed circuit board taking advantage of the flexibility of the wire bonding connections of the image sensor chip, Fixing in place the adjusted image sensor chip relative to the printed circuit board, Forming the printed circuit board on which the chip support and the support plate are mounted, and contacting the wire bonding connections with the wire bonding areas of the printed circuit board, Forming an objective lens housing with an optical system, Connecting the objective lens housing to the support plate in a force-based, shape-based or material-based manner, Adjusting the chip support by moving it along the optical axis of the optical system using adjustment means, and Fixing in place the adjusted chip support using a fixing means.

10. A method of manufacturing a camera module comprising an image sensor chip with wire bonding connections, and a printed circuit board for contacting the image sensor chip, an assembly comprising i) the image sensor chip arranged on a chip support having a circular contour and ii) the printed circuit board, a support plate having a recess adapted to a contour of the chip support, the printed circuit board having a receiving opening adapted to a contour of the image sensor chip and arranged on the support plate, the method comprising:

Forming the assembly made up of the support plate and the printed circuit board arranged thereon, the receiving opening and the recess being centered to each other, Forming an objective lens housing with an optical system, Connecting the objective lens housing to the support plate in a force-based, shape-based or material-based manner, Forming the chip support with the image sensor chip, Adjusting the chip support by moving it along the optical axis of the optical system using adjustment means, and Fixing in place the adjusted chip support using a fixing means.

11. The method according to claim 9, wherein gripping means which extend through access openings in the printed circuit board and serve to grip the chip support are used as adjustment means.

12. A method of manufacturing a camera module comprising an image sensor chip with wire bonding connections, and a printed circuit board for contacting the image sensor chip, an assembly comprising i) the image sensor chip arranged on a chip support having a circular contour and ii) the printed circuit board, a support plate having a recess adapted to a contour of the chip support, the printed circuit board having a receiving opening adapted to a contour of the image sensor chip and arranged on the support plate, and a fixing means comprising at least one bridge, the method comprising:

Forming the support plate with a chip support connected thereto by the at lea one bridge, Mounting the support plate on the printed circuit board, and contacting the wire bonding connections with the wire bonding areas of the printed circuit board, Forming an objective lens housing with an optical system, Connecting the objective lens housing to the support plate in a force-based or shape-based manner, and Adjusting and fixing in place the chip support by plastically deforming the at least one bridge.

13. The method according to claim 11, wherein the at least one bridge is plastically deformed by exerting a force on the chip support adjacent to the bridge.

14. The method according to claim 12, wherein, the at least one bridge is plastically deformed by supplying energy into the at least one bridge.

15. The method according to claim 11, wherein the adjusting and the fixing comprise:

Measuring the current focus position by a focusable collimator to determine a sharpness curve, Using the sharpness curve to determine a correction value for the plastic bending of the at least one bridge in order to achieve an optimum focus position, and Adjusting to the optimum focus position according to the determined correction value by plastically bending the at least one bridge taking into account the elasticity of the material of the bridge(s).

16. The method according to claim 14, wherein before measuring the current focus position, the chip support is pre-tensioned by exerting a force on the at least one bridge.

17. The method according to claim 15, wherein before determining a correction value, the at least one bridge is pre-bent by exerting a force.

18. The method according to claim 11, wherein at least three focusable collimators arranged equidistantly on a circular path around the center of the image sensor chip are used to focus-adjust the image sensor chip throughout the sensor surface.

19. The method according to claim 9, wherein the fixing means is an adhesive connection which is introduced between the chip support and the support plate and/or the printed circuit board.

20. The method according to claim 12, wherein at least three focusable collimators arranged equidistantly on a circular path around the center of the image sensor chip are used to focus-adjust the image sensor chip throughout the sensor surface.

* * * * *